(12) United States Patent
Ma et al.

(10) Patent No.: US 7,881,100 B2
(45) Date of Patent: Feb. 1, 2011

(54) STATE MACHINE SENSING OF MEMORY CELLS

(75) Inventors: Yantao Ma, Boise, ID (US); Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 425 days.

(21) Appl. No.: 12/099,575

(22) Filed: Apr. 8, 2008

(65) Prior Publication Data

US 2009/0251952 A1    Oct. 8, 2009

(51) Int. Cl.
*G11C 11/00* (2006.01)
(52) U.S. Cl. .................................. 365/163; 365/148
(58) Field of Classification Search .............. 365/163, 365/148, 189.07
See application file for complete search history.

(56) References Cited

U.S. PATENT DOCUMENTS

| | | | |
|---|---|---|---|
| 5,790,454 | A | 8/1998 | Choi |
| 5,796,667 | A | 8/1998 | Sweha et al. |
| 6,791,885 | B2 | 9/2004 | Casper et al. |
| 6,813,177 | B2 | 11/2004 | Lowrey et al. |
| 6,985,383 | B2 | 1/2006 | Tang et al. |
| 6,998,698 | B2 | 2/2006 | Inoue et al. |
| 7,075,817 | B2 | 7/2006 | Rinerson et al. |
| 7,123,530 | B2 | 10/2006 | Voshell |
| 7,180,767 | B2 | 2/2007 | Chen et al. |
| 7,190,608 | B2 | 3/2007 | Williford et al. |
| 7,242,174 | B1 | 7/2007 | Sheu et al. |
| 7,242,603 | B2 | 7/2007 | Hush et al. |
| 7,257,039 | B2 | 8/2007 | Bedeschi et al. |
| 7,489,553 | B2 * | 2/2009 | Mokhlesi ............... 365/185.21 |
| 7,529,124 | B2 * | 5/2009 | Cho et al. .................. 365/163 |
| 7,724,564 | B2 * | 5/2010 | Taylor et al. ............... 365/148 |
| 2004/0108890 | A1 | 6/2004 | Choi et al. |
| 2005/0201171 | A1 | 9/2005 | Choi et al. |
| 2006/0164898 | A1 * | 7/2006 | Pio .......................... 365/210 |
| 2007/0133271 | A1 | 6/2007 | Cho et al. |
| 2007/0268742 | A1 | 11/2007 | Liu |
| 2008/0037317 | A1 | 2/2008 | Liu et al. |

OTHER PUBLICATIONS

International Search Report and Written Opinion for related PCT Application PCT/US2009/001788, dated Nov. 13, 2009 (15 pgs.).
Hudgens, S., et al. "Overview of Phase-Change Chalcogenide Nonvolatile Memory Technology," Materials Research Society, pp. 829-832. (Nov. 2004).
Kozicki, Michael N., et al. "Non-Volatile Memory Based on Solid Electrolytes," Non-volatile Memory Technology Symposium, pp. 10-17, Nov. 15-17, 2004.

(Continued)

*Primary Examiner*—Anh Phung
(74) *Attorney, Agent, or Firm*—Brooks, Cameron & Huebsch, PLLC

(57) ABSTRACT

The present disclosure includes methods, devices, modules, and systems for sensing memory cells using a state machine. One method embodiment includes generating a first sensing reference according to a first output of a state machine. The method includes bifurcating a range of possible programmed levels to which a memory cell can be programmed with the first sensing reference. The method also includes generating a second sensing reference according to a second output of the state machine. The method further includes determining a programmed level of the memory cell with the second generated sensing reference.

27 Claims, 15 Drawing Sheets

OTHER PUBLICATIONS

Lee, Myoung-Jae, et al. "2-stack 1D-1R Cross-point Structure with Oxide Diodes as Switch Elements for High Density Resistance Applications," IEEE, pp. 771-774. (2007).

Lee, S.H , et al. "Full Integration and Cell Characteristics for 64Mb Nonvolatile PRAM," Symposium on VLSI Technology Digest of Technical Papers, pp. 20-21. (2004).

Ovonyx, "Ovonic Unified Memory," Technical Presentation, www.ovonyx.com/technology/technology.pdf (accessed Apr. 2, 2008).

Ovshinsky, Stanford R., "A new information paradigm-the ovonic cognitive computer," Optoelectronic Materials and Devices Series. (Jun. 2004)

* cited by examiner

*Fig. 5A*

| FIG. 5A-1 |
|---|
| FIG. 5A-2 |

500-A1

| MULTI-LEVEL BIT | | |
|---|---|---|
| 534 | FIRST DIGIT | SECOND DIGIT |
| 530 — Log(R) < 1/6 log(R1)+5/6log(R0) | 0 | 0 |
| 531 — 1/6 log(R1)+5/6log(R0) < log(R) < 1/2 log(R0*R1) | 0 | 1 |
| 532 — 1/2 log(R0*R1) < log(R) < 5/6 log(R1)+1/6log(R0) | 1 | 0 |
| 533 — 5/6 log(R1)+1/6log(R0) < log(R) | 1 | 1 |

| FIG. 5B-1 |
| FIG. 5B-2 |

500-B1

| MULTI-LEVEL BIT | | |
|---|---|---|
| 564 | FIRST DIGIT | SECOND DIGIT |
| 560 — R < 1/6 R1 + 5/6 R0 | 0 | 0 |
| 561 — 1/6 R1 + 5/6 R0 < R < 1/2 R1 + 1/2 R0 | 0 | 1 |
| 562 — 1/2 R1 + 1/2 R0 < R < 5/6 R1 + 1/6 R0 | 1 | 0 |
| 563 — 5/6 R1 + 1/6 R0 < R | 1 | 1 |

*Fig. 5B-1*

| Self On-die reference Req | 5/6 Rmax or 5/6 log(Rmax) | 1/2 Rmax or 1/2 log(Rmax) | 1/6 Rmax or 1/6 log(Rmax) |
|---|---|---|---|
| Va | Low | High | High |
| Vb | Low | Low | High |

STATE MACHINE SENSING OF MEMORY CELLS

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), flash memory, and resistance variable memory, among others.

Resistance variable memory devices may be used as non-volatile memory for a wide range of electronic applications. Resistance variable memory devices can include phase change random access memory (PCRAM) and resistive random access memory (RRAM), among others. A physical layout of a PCRAM device may resemble that of a DRAM device where the capacitor of the DRAM cell is replaced by a phase change material, e.g., Germanium-Antimony-Telluride (GST) or other chalcogenide materials. That is, an access device such as a diode or metal oxide semiconductor field effect transistor (MOSFET) can be connected in series with the phase change material. Chalcogenide materials can include compounds of sulfides, selenides, and tellurides, among others. GST has been used in rewriteable optical discs, e.g., rewritable compact discs (CD-RW) and rewritable digital versatile discs (DVD-RW), among others. Development is underway for the use of GST in memory cells for RAM applications. A physical layout of an RRAM device may include memory cells including a resistance variable thin film, e.g., a colossal magnetoresistive material. The thin film can be connected to an access device such as a diode, a field effect transistor (FET), or a bipolar junction transistor (BJT).

Memory cells can be programmed to a programmed level. The resistance of a PCRAM device can be altered by applying energy pulses to the phase change material, e.g., GST. For example, material properties of the GST may be altered by heating it with a programming current. Generally, a higher resistance level may be associated with a more amorphous state of the GST, and a lower resistance level may be associated with a more crystalline state of the GST. The resistance of a thin film RRAM device can be increased and/or decreased by applying positive and/or negative electrical pulses across the film.

To sense data stored on a resistance variable memory cell, the resistance of the memory cell may be sensed indirectly. In a binary system, a low resistance may correspond to a first value, e.g., 0, and a high resistance may correspond to a second value, e.g., 1. In some binary systems, a low resistance may correspond to a value of 1 while a high resistance corresponds to a value of 0. During a sensing operation, a sensed voltage and/or current corresponding to a resistive state of a selected memory cell may be compared to a reference voltage and/or current to determine if the cell has a greater or lesser resistive level thereby indicating the content of stored data. That is, the resistance of the selected memory cell may be sensed indirectly. For example, a transient response of a sensing circuit that is connected to the selected memory cell may be sensed, e.g., in response to a change in voltage or current.

A single level cell (SLC) can represent two programmed levels as represented by the binary digits 1 or 0. Memory cells can also store more than two binary digits, e.g., 1111, 0111, 0011, 1011, 1001, 0001, 0101, 1101, 1100, 0100, 0000, 1000, 1010, 0010, 0110, and 1110. Such cells may be referred to as multi state memory cells, multidigit cells, or multilevel cells (MLCs). MLCs can allow the manufacture of higher density memories without increasing the number of memory cells since each cell can represent more than one digit, e.g., more than one bit. Some non-volatile memories, such as flash, may achieve MLC functionality by storing one of a range of charges on a floating gate memory cell. Resistance variable memories may achieve MLC functionality by programming a memory cell to one of a range of resistances.

BRIEF DESCRIPTION OF THE DRAWINGS

FIG. 5A-1 illustrates a table of resistance ranges and corresponding binary data for a phase change memory device in accordance with one or more embodiments of the present disclosure.

FIG. 5A-2 illustrates a flow chart for sensing a phase change memory device in accordance with one or more embodiments of the present disclosure.

FIG. 5B-1 illustrates a table of resistance ranges and corresponding binary data for a resistive switching memory device in accordance with one or more embodiments of the present disclosure.

FIG. 5B-2 illustrates a flow chart for sensing a resistive switching memory device in accordance with one or more embodiments of the present disclosure.

FIG. 7 illustrates a table reflecting equivalent resistances corresponding to a portion of the circuit illustrated in FIG. 6 in accordance with one or more embodiments of the present disclosure.

DETAILED DESCRIPTION

The present disclosure includes methods, devices, modules, and systems for sensing memory cells using a state machine. One method embodiment includes generating a first sensing reference according to a first output of a state machine. The method includes bifurcating a range of possible programmed levels to which a memory cell can be programmed with the first sensing reference. The method also includes generating a second sensing reference according to a second output of the state machine. The method further includes determining a programmed level of the memory cell with the second generated sensing reference.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

Figure 1:
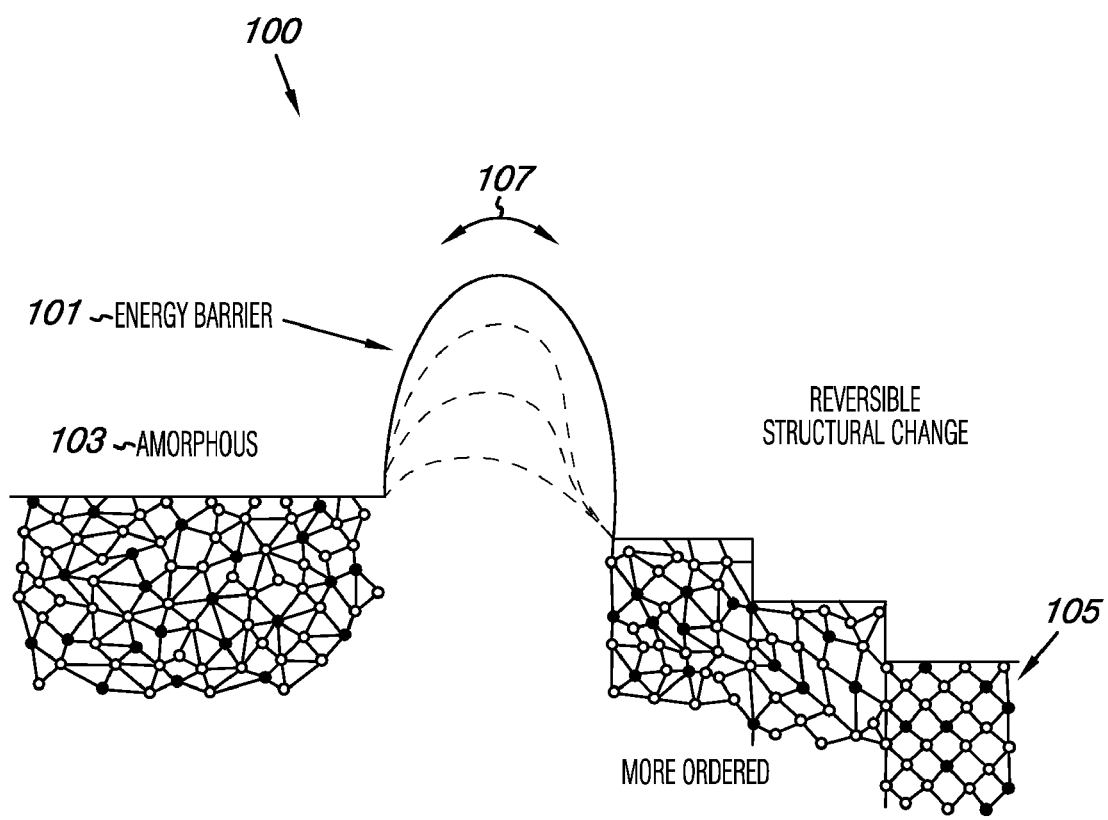
FIG. 1 illustrates a prior art diagram of a phase change energy barrier.

FIG. 1 illustrates a prior art diagram 100 of a phase change energy barrier 101. A chemical energy barrier between amorphous 103 and crystalline 105 structural phases may be reversibly 107 overcome by various external energy inputs. Examples of such inputs include light, heat, electric field, chemical catalyst, and stress-tension pressure. For example, applying one or more programming pulses to a memory cell containing a phase change material may be associated with a structural change in the material. Structural changes in such a material can effect corresponding changes in material resistance, capacitance, dielectric constant, charge retention, index of refraction, surface reflection, light absorption, transmission, and scattering, differential wetting and sorption, as well as other changes such as magnetic susceptibility.

Phase change materials can be used to create resistance variable memory devices. A single level cell (SLC) can be programmed to a generally more amorphous (reset) state or a generally more crystalline (set) state. Such reset and/or set states may correspond to a binary 0 and/or 1 for SLC devices. A reset pulse can include a relatively high current pulse applied to the cell for a relatively short period of time. The current applied to the cell can be quickly reduced after the phase change material "melts" allowing it to cool quickly into a more amorphous state where atomic motion that can allow crystallization generally occurs to a lesser degree due, at least in part, to relatively rapid cooling of the material. Conversely, a set pulse can include a relatively lower current pulse applied to the cell for a relatively longer period of time with a slower quenching speed, e.g., the current may be more slowly reduced allowing the phase change material greater time to cool. Accordingly, the material may crystallize to a greater degree than after the reset pulse. Some phase change materials can have a greater resistivity associated with a more amorphous state and a lesser resistivity associated with a more crystalline state.

Figure 2:
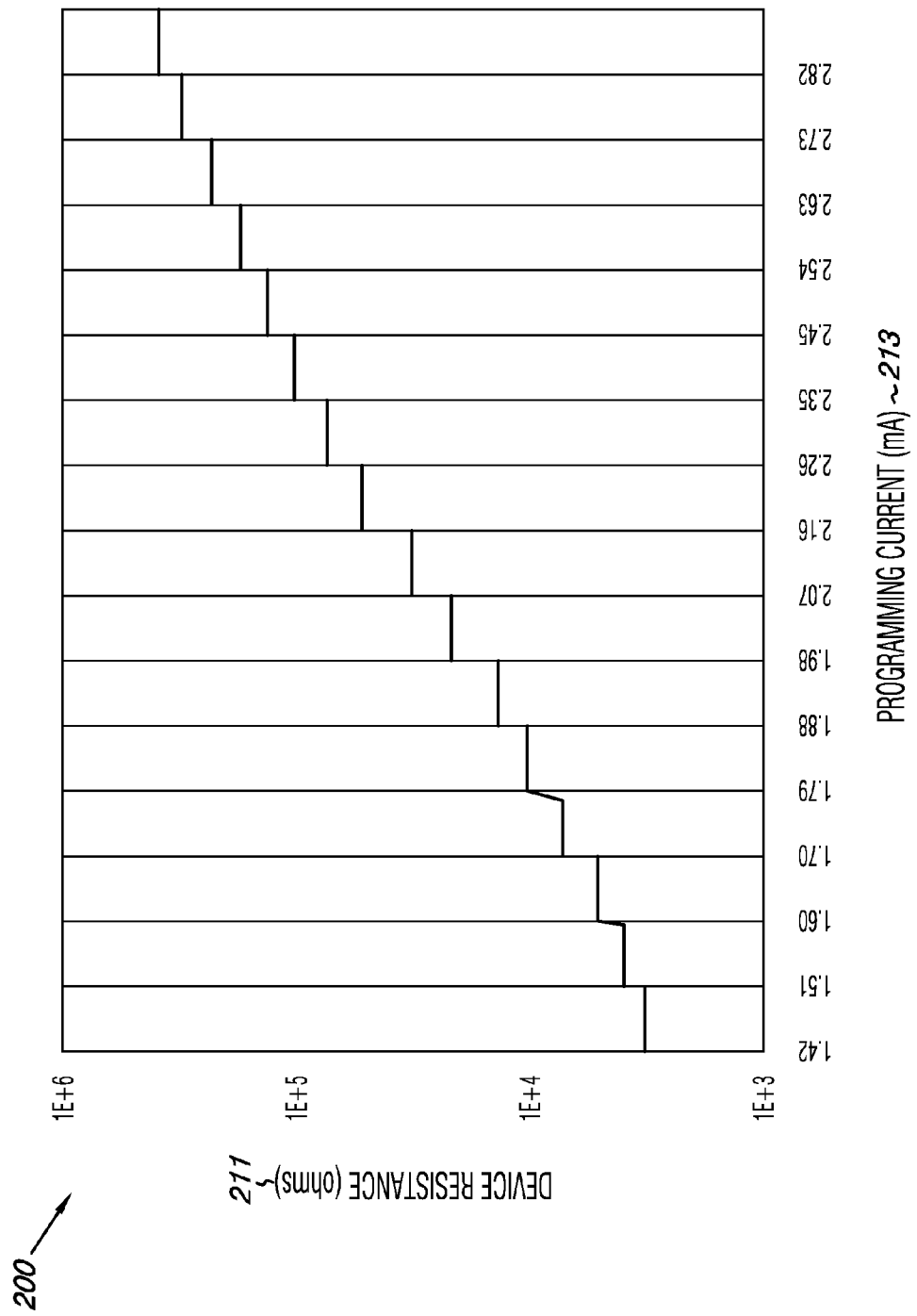
FIG. 2 illustrates a prior art graph of resistance versus programming current for a resistance variable multilevel memory cell.

FIG. 2 illustrates a prior art graph 200 of resistance 211 versus programming current 213 for a resistance variable multilevel memory cell. A phase change memory cell can be programmed to one or more intermediate states between amorphous and crystalline states allowing for a memory device including multilevel cells (MLCs). That is, a phase change material can be programmed to various levels of structural order, analogous to the indication of various "more ordered" states in FIG. 1. Through application of one or more programming pulses at particular current levels, a phase change memory cell can be programmed to a given resistance level. With appropriate programming currents, phase change memory cells can be programmed to intermediate states having a partial amorphous and partial crystalline structure, providing for multilevel resistance states. The graph in FIG. 2 indicates sixteen programming levels that can be used with a four bit cell. The number of programming levels chosen for a particular device can be based on the desired application, as well as design and process limits, e.g., programming time, sensing time, and accuracy of sensing circuitry, among others.

Figure 3A:
FIG. 3A illustrates a graph representing resistance levels associated with a number of programmed levels with respect to current for a phase change memory device in accordance with one or more embodiments of the present disclosure.
Figure 3A:
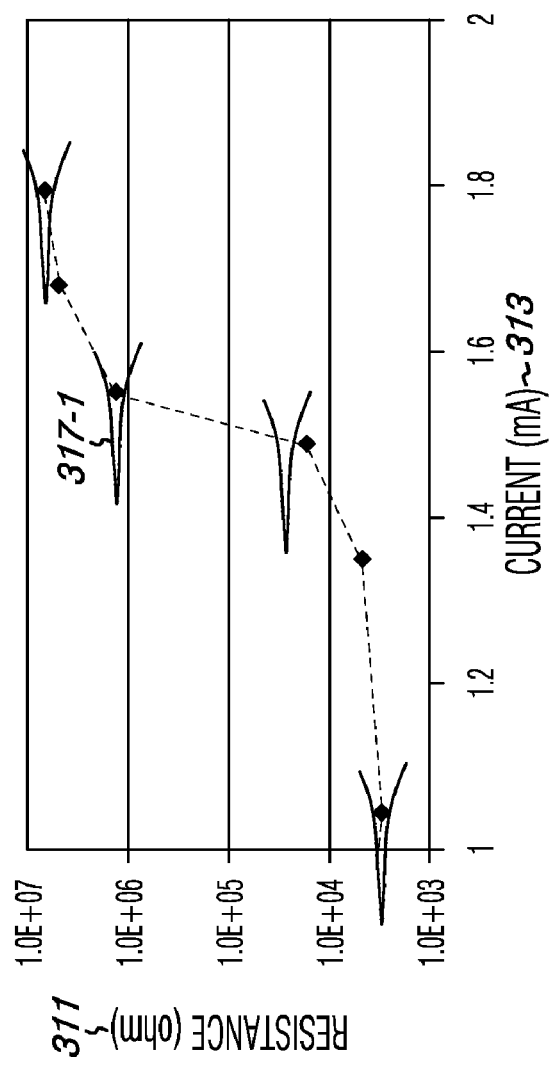

FIG. 3A illustrates a graph 300 representing resistance 311 levels associated with a number of programmed levels with respect to current 313 for a phase change memory device in accordance with one or more embodiments of the present disclosure. The ranges, e.g., range 317-1, correspond to four programmed levels that can be used with a two bit phase change memory cell. The graph in FIG. 3A illustrates a four order of magnitude difference in resistance level for the amorphous-most and crystalline-most states for a particular memory cell.

Figure 3B:
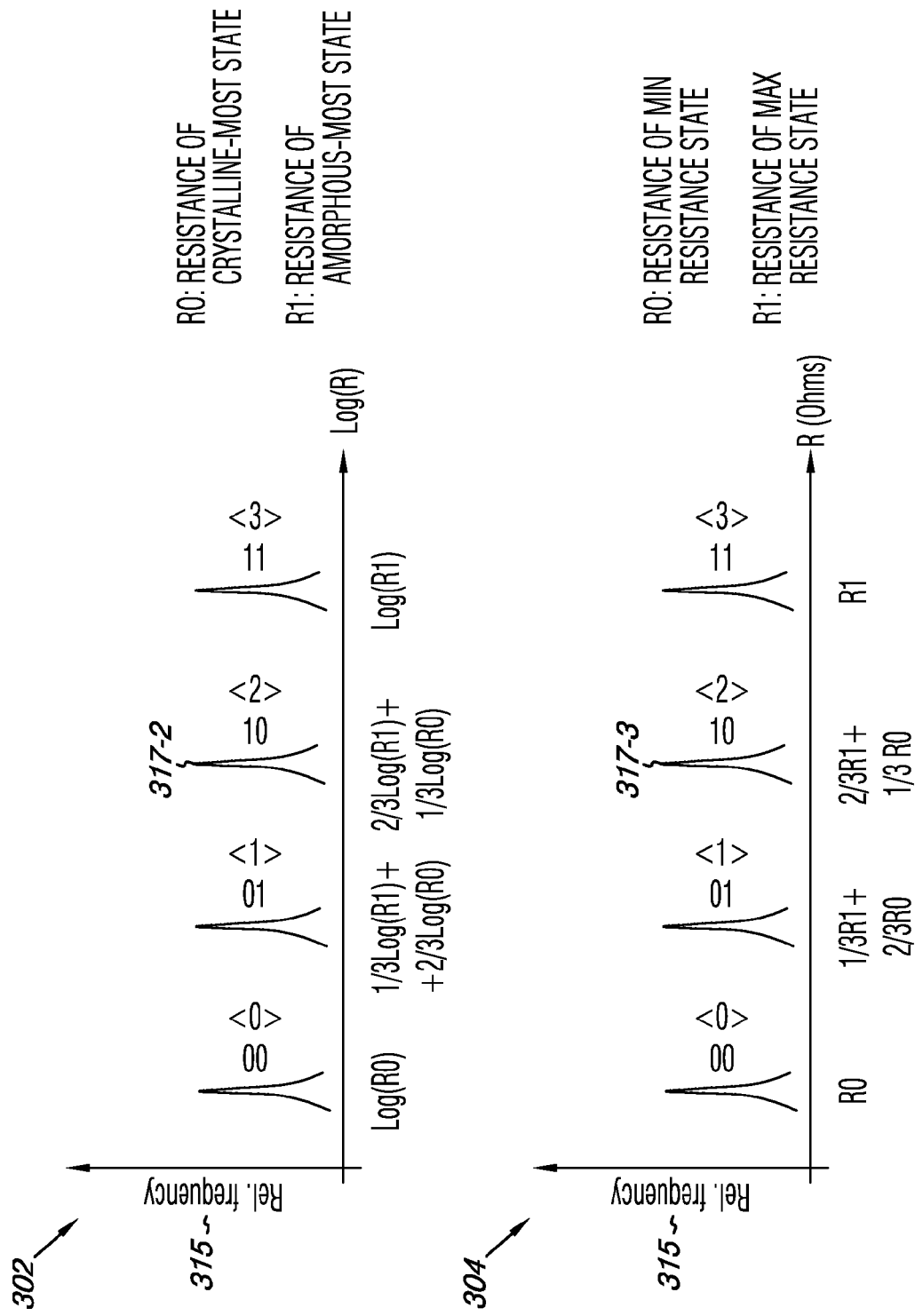
FIG. 3B illustrates graphs representing resistance levels associated with a number of programmed levels for resistance variable memory devices in accordance with one or more embodiments of the present disclosure.

FIG. 3B illustrates graphs 302 and 304 representing resistance levels associated with a number of programmed levels for resistance variable memory devices in accordance with one or more embodiments of the present disclosure. The ranges, e.g., range 317-2, in the graph 302 correspond to relative frequency 315 distributions of four programmed resistance levels that can be used with a two bit phase change memory cell. R0 represents the crystalline-most state for a particular memory cell, e.g., state 0 corresponding to binary data 00. R1 represents the amorphous-most state for the particular memory cell, e.g., state 3 corresponding to binary data 11. Intermediate states include state 1 corresponding to binary data 01 and state 2 corresponding to binary data 10. Peaks of the distributions of programmed levels for the particular phase change memory cell can occur at the logarithm (Log) of R0 for state 0, ⅓ Log R1+⅔ Log R0 for state 1, ⅔ Log R1+⅓ Log R0 for state 2, and Log R1 for state 3. The logarithmic scale illustrated in FIG. 3A corresponds to the physical increase in resistance with programmed levels for a phase change memory device, which may change logarithmically rather than, for example, linearly.

A phase change material can include a number of Germanium-Antimony-Tellurium (GST) materials, e.g., Ge—Sb—Te such as $Ge_2Sb_2Te_5$, $Ge_1Sb_2Te_4$, $Ge_1Sb_4Te_7$, etc. The hyphenated chemical composition notation, as used herein, indicates the elements included in a particular mixture or compound, and is intended to represent all stoichiometries involving the indicated elements. Other phase change materials can include GeTe, In—Se, $Sb_2Te_3$, GaSb, InSb, As—Te, and Al—Te. Additional phase change materials can include Ge—Sb—Te, Te—Ge—As, In—Sb—Te, Te—Sn—Se, Ge—Se—Ga, Bi—Se—Sb, Ga—Se—Te, Sn—Sb—Te, and In—Sb—Ge. Some phase change memories may include a phase change material such as Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among others.

The ranges, e.g., range 317-3, in the graph 304 correspond to relative frequency 315 distributions of four programmed levels that can be used with a two bit resistive switching memory cell. R0 represents the least resistive state for a particular memory cell, e.g., state 0 corresponding to binary data 00. R1 represents the most resistive state for the particular memory cell, e.g., state 3 corresponding to binary data 11. Intermediate states include state 1 corresponding to binary data 01 and state 2 corresponding to binary data 10. Peaks of the distributions of programmed levels for the particular resistive switching memory cell can occur at the R0 for state 0, ⅓ R1+⅔ R0 for state 1, ⅔ R1+⅓ R0 for state 2, and R1 for state 3. The linear scale illustrated in FIG. 3A corresponds to the physical increase in resistance with programmed levels for a resistive switching memory device, which may change linearly, rather than logarithmically as taught above with respect to graph 302.

Some examples of resistive random access memory (RRAM) technologies include binary metal oxide, perovskite oxide, colossal magnetorestive, and polymer. Binary metal oxides can include $HfO_x$, $Nb_2O_5$, $Al_2O_3$, $WO_x$, $Ta_2O_5$, $TiO_x$, $ZrO_x$, $Cu_xO$, $Ni_xO$, and $Fe_xO$, among others. Perovskite oxides can include doped or undoped $SrTiO_3$, $SrZrO_3$, and $BaTiO_3$, for example. Colossal magnetoresistive materials can include $Pr_{(1-x)}Ca_xMnO_3$ (PCMO), $La_{(1-x)}CaxMnO_3$ (LCMO), and $Ba_{(1-x)}Sr_xTiO_3$, and others as will be understood by one of ordinary skill in the art. Polymer materials suitable for use with RRAM devices can include Bengala Rose, $AlQ_3Ag$, Cu-TCNQ, DDQ, TAPA, and Fluorescine-based polymers, among others.

Figure 4A:
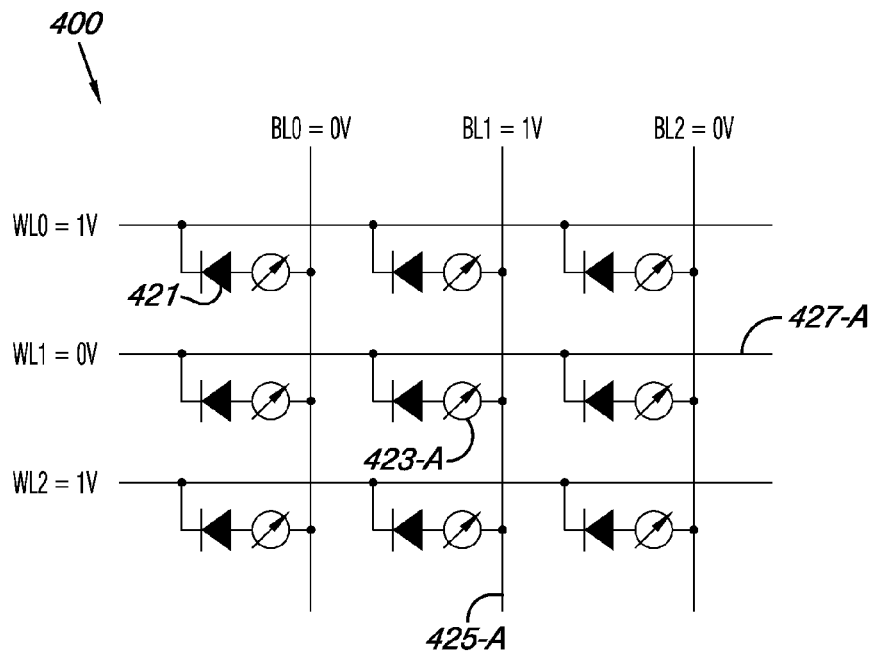
FIG. 4A illustrates a portion of a prior art schematic of a memory array including diode access devices for a resistance variable memory device.

FIG. 4A illustrates a portion 400 of a prior art schematic of a memory array including diode access devices, e.g., diode 421, for a resistance variable memory device. The memory array portion includes a number of resistance variable memory elements, e.g., a phase change element or a resistive switching element. Each resistance variable memory element, e.g. element 423-A, is coupled to a sense line, e.g., sense line 425-A, and to a select line, e.g., select line 427-A, by an access diode. As illustrated in FIG. 4A, to access memory element 423-A, a corresponding select line "WL1" can be biased at a first voltage, e.g. 0V, while surrounding select lines are biased at a second voltage, e.g., 0V. A sense line "BL1" corresponding to memory element 423-A can be biased at a first voltage, e.g., 1V while surrounding sense lines can be biased at a second voltage, e.g., 0V. Accessing, e.g., "turning on," the memory cell as such can enable sensing of the memory cell, among other functions.

Figure 4B:
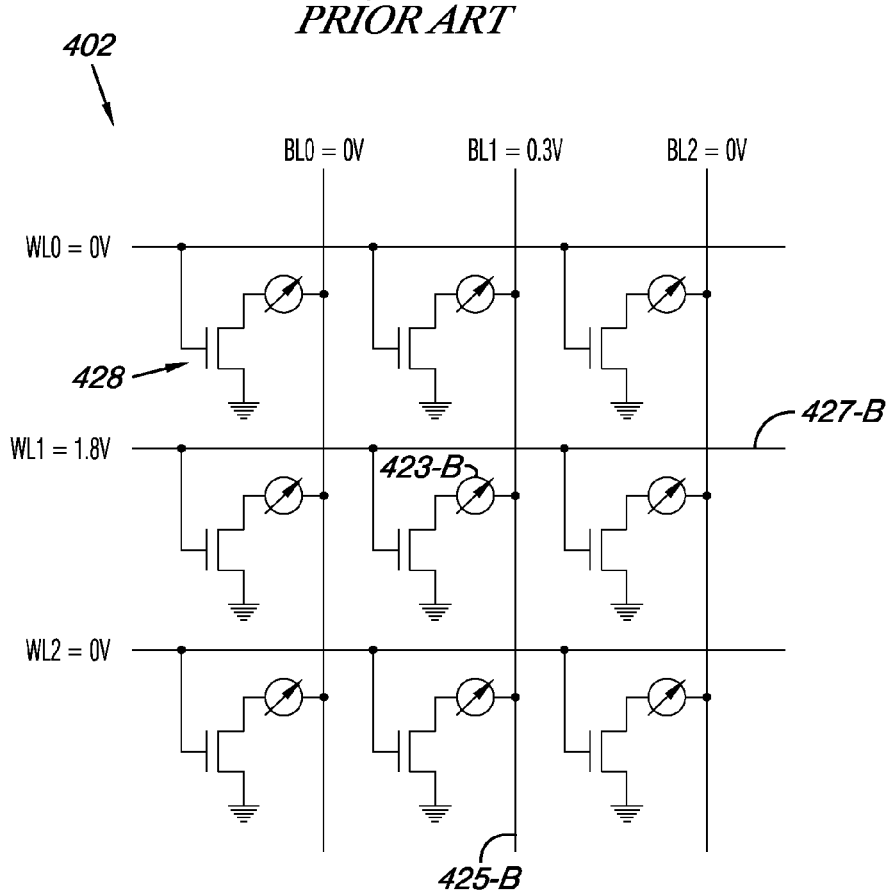
FIG. 4B illustrates a portion of a prior art schematic of a memory array including metal oxide semiconductor field effect transistor access devices for a resistance variable memory device.

FIG. 4B illustrates a portion 402 of a prior art schematic of a memory array including metal oxide semiconductor field effect transistor access devices, e.g., device 428, for a resistance variable memory device. The memory array portion includes a number of resistance variable memory elements, e.g., a phase change element or a resistive switching element. Each resistance variable memory element, e.g., memory element 423-B, is coupled to a sense line, e.g., sense line 425-B and to a select line, e.g., select line 427-B, by an access transistor, e.g., a metal oxide semiconductor field effect transistor (MOSFET). As illustrated in FIG. 4B, to access memory element 423-B, a corresponding select line "WL1" can be biased at a first voltage, e.g. 1.8V, while surrounding select lines are biased at a second voltage, e.g., 0V. A sense line "BL1" corresponding to memory element 423-B can be biased at a first voltage, e.g., 0.3V while surrounding sense lines can be biased at a second voltage, e.g., 0V. Accessing, e.g., "turning on," the memory cell as such can enable sensing of the memory cell, among other functions.

Figure 4C:
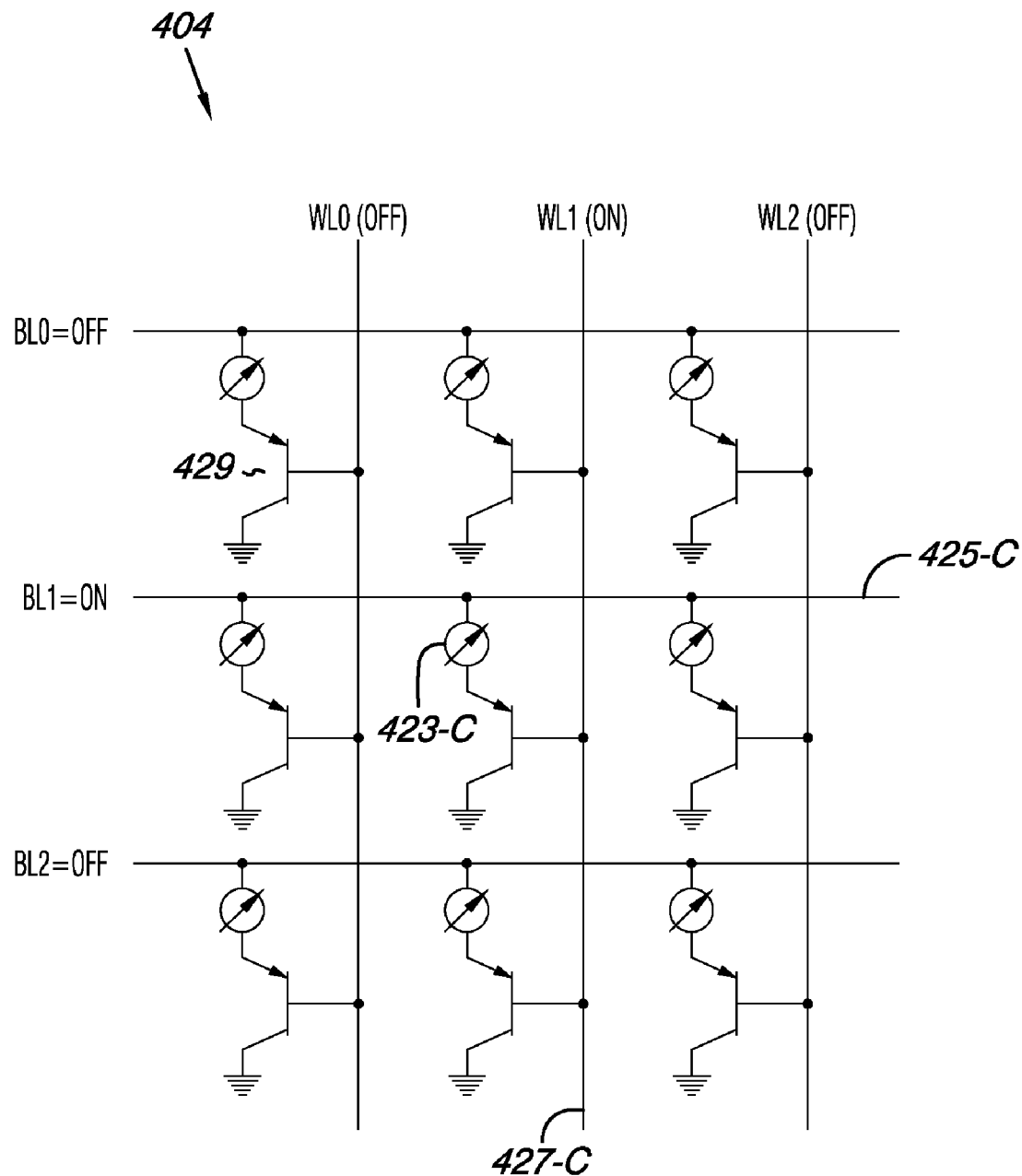
FIG. 4C illustrates a portion of a prior art schematic of a memory array including bipolar junction transistor access devices for a resistance variable memory device.

FIG. 4C illustrates a portion 404 of a prior art schematic of a memory array including bipolar junction transistor access devices, e.g., device 429, for a resistance variable memory device. The memory array portion includes a number of resistance variable memory elements, e.g., a phase change element or a resistive switching element. Each resistance variable memory element, e.g., memory element 423-C, is coupled to a sense line, e.g., sense line 425-C, and to a select line, e.g., select line 427-C, by an access transistor, e.g., a bipolar junction transistor (BJT). As illustrated in FIG. 4C, to access memory element 423-C, a corresponding select line "WL1" can be turned on, e.g., biased at 0V, while surrounding select lines turned off, e.g., biased at 1V. A sense line "BL1" corresponding to memory element 423-C can be biased with a particular voltage, e.g., 1V, while surrounding sense lines can be biased at 0V or a positive voltage smaller than the voltage corresponding to the select lines, e.g., 0.2V. Accessing, e.g., "turning on," the memory cell as such can enable sensing of the memory cell, among other functions. Although the particular BJTs illustrated in FIG. 4C represent PNP type transistors, NPN type transistors are also possible with resistive variable memory devices.

FIGS. 4A-4C are provided to illustrate a number of access devices and example operating parameters for resistance variable memory cells. However, embodiments of the present disclosure are not so limited. Other access devices, memory array architectures, and operating parameters are possible, as will be understood by one of ordinary skill in the art.

Figures 2, 5A:
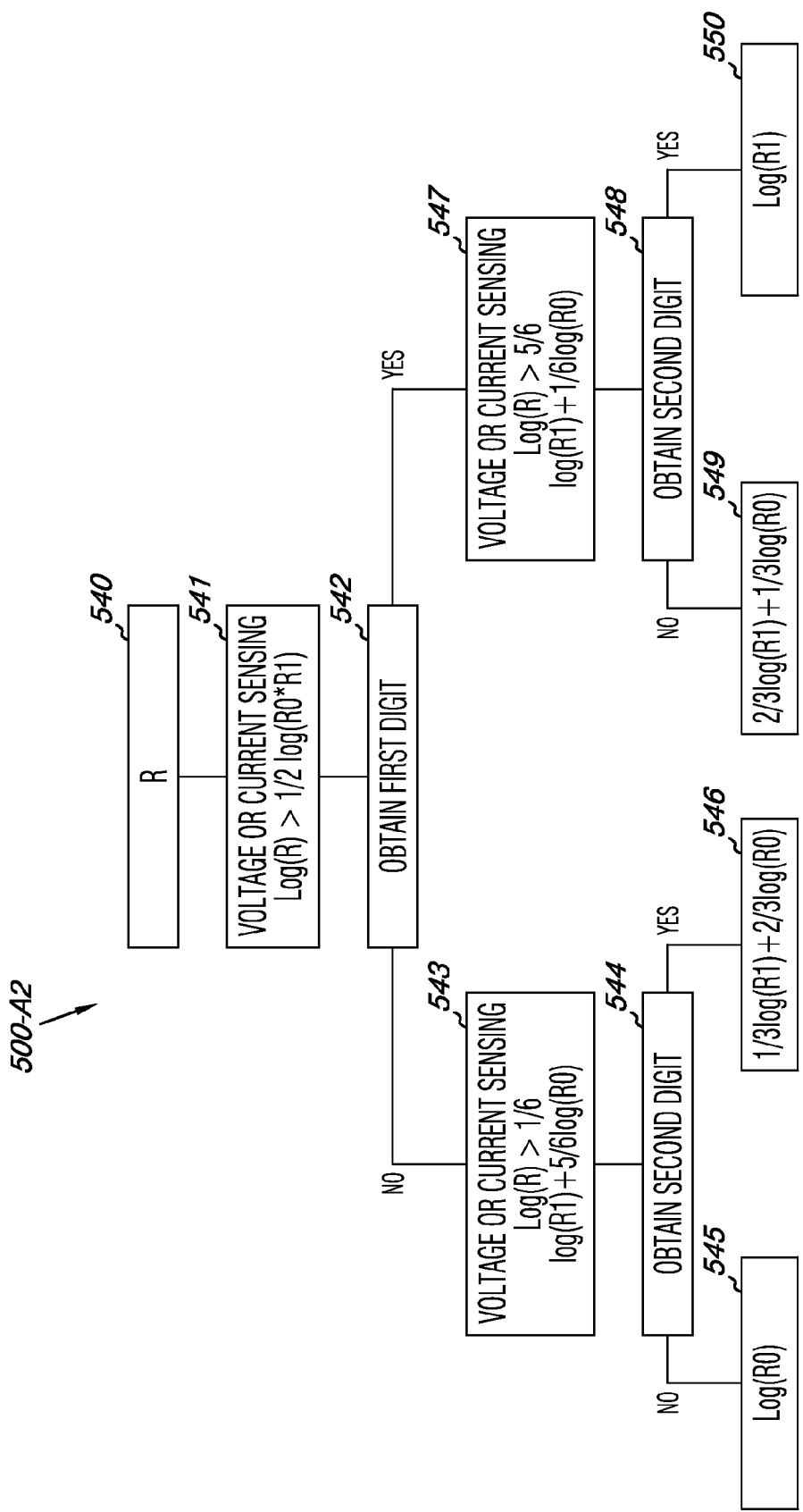

FIG. 5A-1 illustrates a table 500-A1 of resistance ranges and corresponding binary data for a phase change memory device in accordance with one or more embodiments of the present disclosure. The table "Multi-Level Bit" reflects a programmed range in column 534 and corresponding binary data for a phase change memory cell. Sensing levels, described above with respect to FIG. 3A, can be used to sense such a phase change memory cell. As used with respect to FIGS. 5A1-5A2, "R" represents the programmed level of a selected memory cell. "R0" represents the crystalline-most state for a particular memory cell, e.g., state 0 corresponding to binary data 00. "R1" represents the amorphous-most state for the particular memory cell, e.g., state 3 corresponding to binary data 11. Accordingly, a memory cell programmed to a level 530 corresponding to binary data 00 can be programmed to a resistance such that $\log R < \frac{1}{6} \log(R1) + \frac{5}{6} \log(R0)$. A memory cell programmed to a level 531 corresponding to binary data 01 can be programmed to a resistance such that $\frac{1}{6} \log(R1) + \frac{5}{6} \log(R0) < \log R < \frac{1}{2} \log(R0*R1)$. A memory cell programmed to a level 532 corresponding to binary data 10 can be programmed to a resistance such that $\frac{1}{2} \log(R0*R1) < \log R < \frac{5}{6} \log(R1) + \frac{1}{6} \log(R0)$. A memory cell programmed to a level 533 corresponding to binary data 11 can be programmed to a resistance such that $\frac{5}{6} \log(R1) + \frac{1}{6} \log(R0) < \log R$.

FIG. 5A-2 illustrates a flow chart 500-A2 for sensing a phase change memory device in accordance with one or more embodiments of the present disclosure. At 540, a selected memory cell has a particular resistance level. At 541 a voltage or current corresponding to the selected memory cell can be sensed to determine whether $\log(R) > \frac{1}{2} \log(R0*R1)$. An example of sensing circuitry is described below with respect to FIG. 6. The sensing at 541 allows for a determination of a first digit of a binary value corresponding to the programmed level of the selected memory cell at 542. The resistance level sensed via voltage or current sensing at 541 can bifurcate a range of possible programmed levels for the memory cell analogous to that illustrated in FIG. 5A-1, as well as a range of sensing levels analogous to that illustrated in FIG. 3A. Accordingly, upon completion of sensing at 541, it can be known whether the selected memory cell is programmed within one of programmed levels corresponding to binary data 00 and 01, or programmed levels corresponding to binary data 10 and 11. Thus, the first digit of binary data can be determined from the result of sensing at 541. Such a determination of the first bit of binary data can be referred to as hidden first bit sensing.

When a result of sensing at 541 indicates that log(R)<½ log(R0*R1), then a voltage or current corresponding to the selected memory cell can be sensed to determine whether log(R)>⅙ log(R1)+⅚ log(R0) at 543. A result of the sensing at 543, allows for a determination of a second digit of a binary value corresponding to the programmed level of the selected memory cell at 544. Accordingly, both digits of the binary value corresponding to the programmed state of the selected memory cell can be determined. An additional result is allowing for a determination of the programmed resistance level of the selected memory cell. That is, if log(R)<⅙ log(R1)+⅚ log(R0) at 545, then R can be approximately equal to log(R0), and if log(R)>⅙ log(R1)+⅚ log(R0) at 546, then R can be approximately equal to ⅓ log(R1)+⅔ log(R0).

When a result of sensing at 541 indicates that log(R)>½ log(R0*R1), then a voltage or current corresponding to the selected memory cell can be sensed to determine whether log(R)>⅚ log(R1)+⅙ log(R0) at 547. A result of the sensing at 547, allows for a determination of a second digit of a binary value corresponding to the programmed level of the selected memory cell at 548. Accordingly, both digits of the binary value corresponding to the programmed state of the selected memory cell can be determined. An additional result is allowing for a determination of the programmed resistance level of the selected memory cell. That is, if log(R)<⅚ log(R1)+⅙ log(R0) at 549, then R can be approximately equal to ⅔ log(R1)+⅓ log(R0), and if log(R)>⅚ log(R1)+⅙ log(R0) at 550, then R can be approximately equal to log(R1).

Figures 2, 5B:
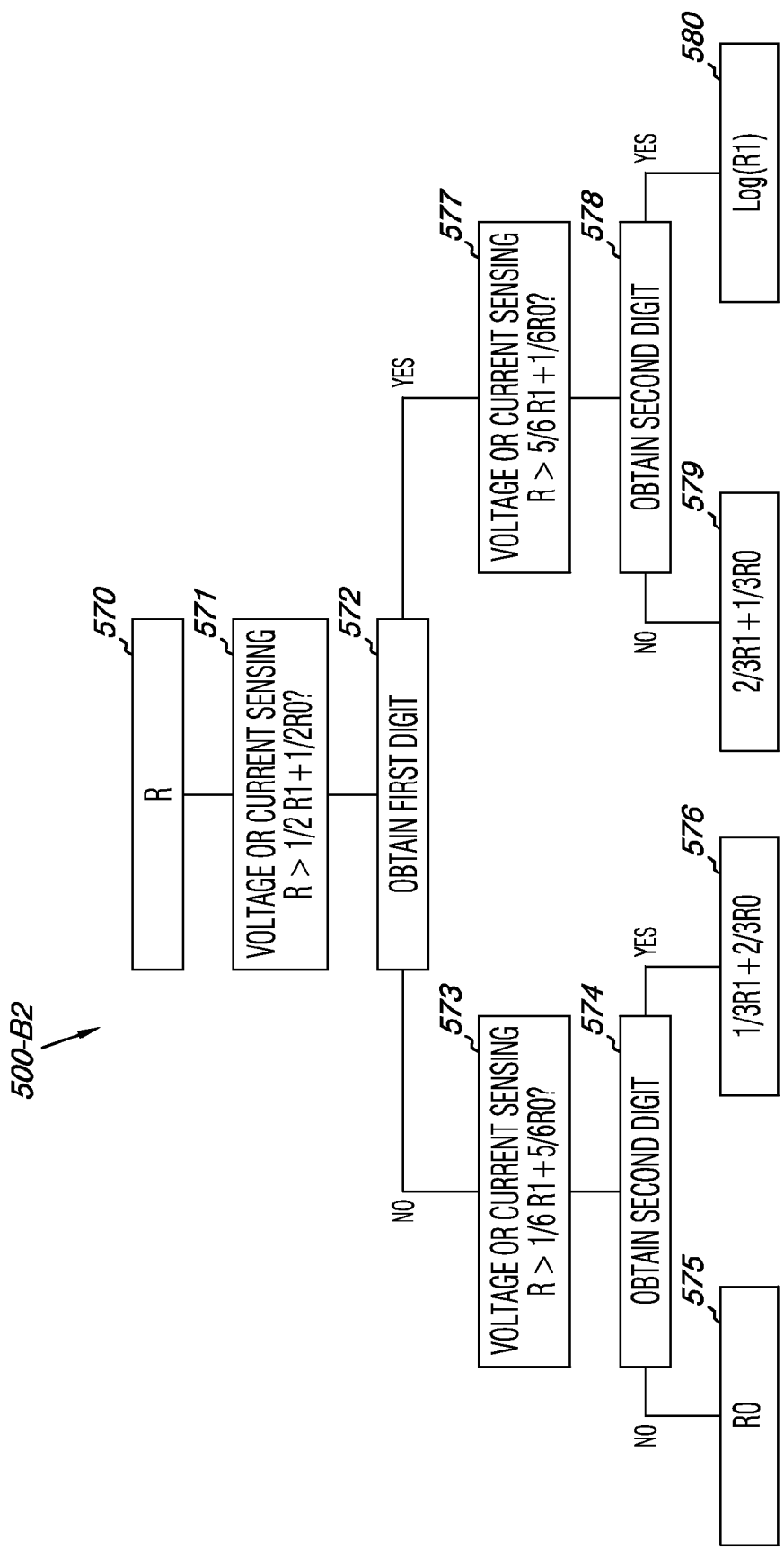

FIG. 5B-1 illustrates a table 500-B1 of resistance ranges and corresponding binary data for a resistive switching memory device in accordance with one or more embodiments of the present disclosure. The table "Multi-Level Bit" reflects a programmed range in column 564 and corresponding binary data for a resistive switching memory cell. Sensing levels, described above with respect to FIG. 3B, can be used to sense such a resistive switching memory cell. As used with respect to FIGS. 5B1-5B2, "R" represents the programmed level of a selected memory cell. "R0" represents the least resistive state for a particular memory cell, e.g., state 0 corresponding to binary data 00. "R1" represents the most resistive state for the particular memory cell, e.g., state 3 corresponding to binary data 11. Accordingly, a memory cell programmed to a level 560 corresponding to binary data 00 can be programmed to a resistance R<⅙ R1+⅚ R0. A memory cell programmed to a level 561 corresponding to binary data 01 can be programmed to a resistance such that ⅙ R1+⅚ R0<R<½ R1+½ R0. A memory cell programmed to a level 562 corresponding to binary data 10 can be programmed to a resistance such that ½ R1+½ R0<R<⅚ R1+⅙ R0. A memory cell programmed to a level 563 corresponding to binary data 11 can be programmed to a resistance such that ⅚ R1+⅙ R0<R.

FIG. 5B-2 illustrates a flow chart for sensing a resistive switching memory device in accordance with one or more embodiments of the present disclosure. At 570, a selected memory cell has a particular resistance level. At 571 a voltage or current corresponding to the selected memory cell can be sensed to determine whether R>½ R1+½ R0. An example of sensing circuitry is described below with respect to FIG. 6. A result of the sensing at 571, allows for a determination of a first digit of a binary value corresponding to the programmed level of the selected memory cell at 572. The resistance level sensed via voltage or current sensing at 571 can bifurcate a range of possible programmed levels for the memory cell analogous to that illustrated in FIG. 3B, as well as a range of sensing levels analogous to that illustrated in FIG. 5B-1. Accordingly, upon completion of sensing at 571, it can be known whether the selected memory cell is programmed within one of programmed levels corresponding to binary data 00 and 01, or programmed levels corresponding to binary data 10 and 11. Thus, the first digit of binary data can be determined from the result of sensing at 571. Such a determination of the first bit of binary data can be referred to as hidden first bit sensing.

When a result of sensing at 571 indicates that R<½ R1+½ R0, then a voltage or current corresponding to the selected memory cell can be sensed to determine whether R>⅙ R1+⅚ R0 at 573. A result of the sensing at 573, allows for a determination of a second digit of a binary value corresponding to the programmed level of the selected memory cell at 574. Accordingly, both digits of the binary value corresponding to the programmed state of the selected memory cell can be determined. An additional result is allowing for a determination of the programmed resistance level of the selected memory cell. That is, if log R<⅙ R1+⅚ R0 at 575, then R can be approximately equal to R0, and if R>⅙ R1+⅚ R0 at 576, then R can be approximately equal to ⅓ R1+⅔ R0.

When a result of sensing at 571 indicates that R>½ R1+½ R0, then a voltage or current corresponding to the selected memory cell can be sensed to determine whether R>⅚ R1+⅙ R0 at 577. A result of the sensing at 577, allows for a determination of a second digit of a binary value corresponding to the programmed level of the selected memory cell at 578. Accordingly, both digits of the binary value corresponding to the programmed state of the selected memory cell can be determined. An additional result is allowing for a determination of the programmed resistance level of the selected memory cell. That is, if R<⅚ R1+⅙ R0 at 579, then R can be approximately equal to ⅔ R1+⅓ R0, and if R>⅚ R1+⅙ R0 at 580, then R can be approximately equal to R1.

Although the embodiments described with respect to FIGS. 5A-1 through 5B-2 include two bit PCRAM and RRAM devices, embodiments are not so limited. Other non-volatile and/or resistance variable devices can be sensed according to one or more embodiments of the present disclosure. For example, one of ordinary skill in the art can extrapolate methods for sensing memory devices having greater or fewer than two bits stored per cell using the teachings of the present disclosure.

Figure 6:
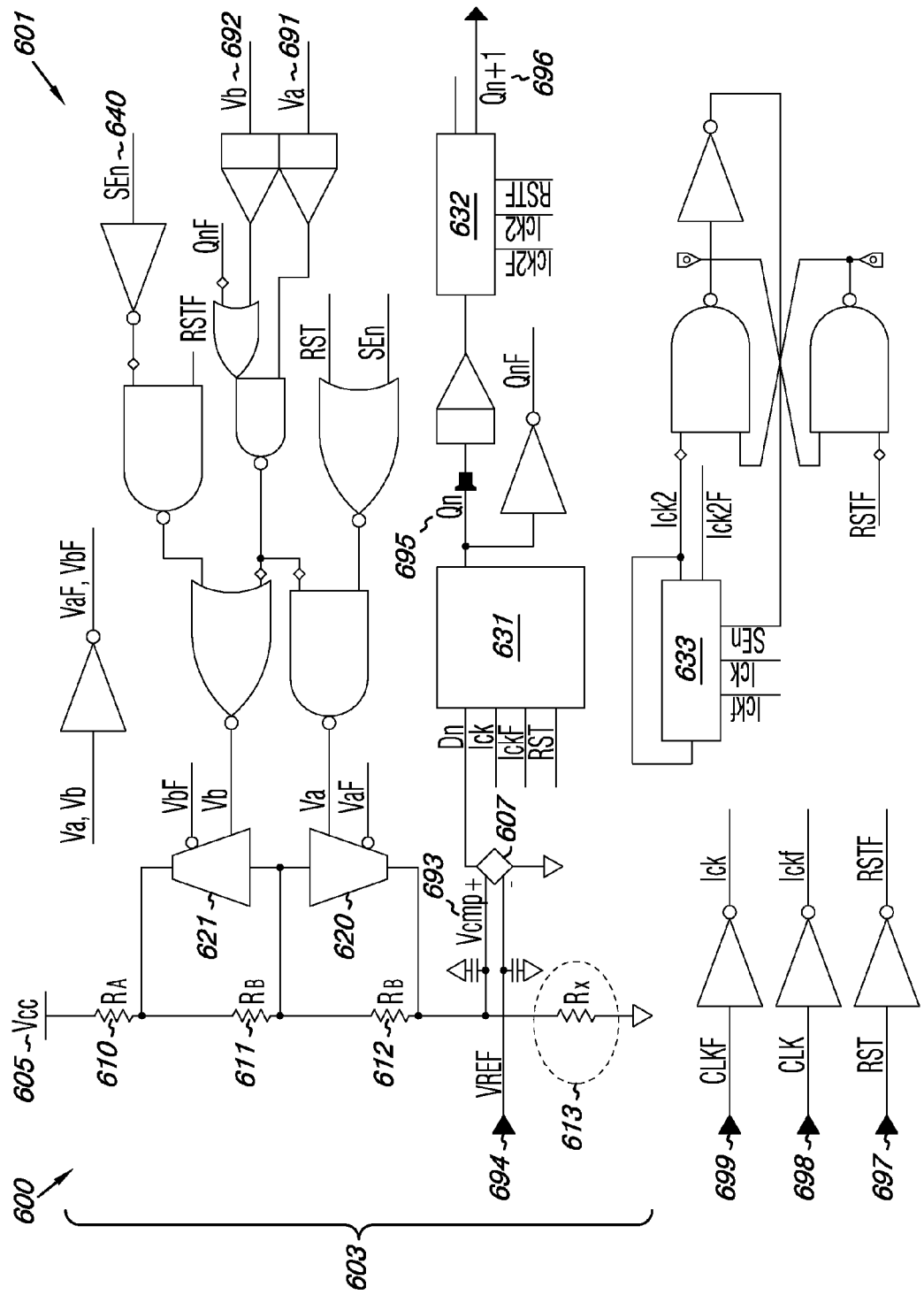
FIG. 6 illustrates a schematic of an embodiment of sensing circuitry in accordance with one or more embodiments of the present disclosure.

FIG. 6 illustrates a schematic of an embodiment of sensing circuitry 600 in accordance with one or more embodiments of the present disclosure. Sensing circuitry 600 can include a state machine 601 including a number of logic gates and registers, e.g., registers 631, 632, and 633. The sensing circuitry 600 can also include a signal divider 603, e.g., a voltage and/or current divider, and a supply signal 605, e.g., a supply voltage or current. The signal divider 603 can include a connection to the supply signal 605 for a number of resistors coupled in series, e.g., resistors 610, 611, and 612. The number of resistors can be selectively coupled to a memory cell 613 that is represented by resistor "Rx" for resistance variable memory cells. The memory cell 613 can be located in an array of memory cells, and selected from the array by means known to one of ordinary skill in the art. Examples of selecting a particular memory cell are discussed with respect to FIGS. 4A-4C above.

The state machine can include a number of inputs and/or outputs such as "Va" 691, "Vb" 692, "Vcmp" 693, "Vref" 694, "Qn" 695, "Qn+1" 696, "RST" 697, "CLK" 698, and "CLKF" 699. State machine input "SEn" 620 can be a sensing enable signal for starting a sensing operation. The designator "F" at the end of some labeled elements indicates an opposite of the element having the same label, but without the "F." For example, "CLKF" can be an opposite clock signal of "CLK." The opposite of a digital signal can include an opposite binary digit, e.g., a 1 instead of a 0.

According to some conventional sensing operations using multiple reference voltages for sensing memory cells, the reference voltages may be applied sequentially starting with the reference voltage used to sense a lowermost programmed level of a selected memory cell. The programmed level of the selected memory cell may be determined by the reference voltage that causes it to conduct. For example, in a four-state cell, three reference voltages may be used. If the first reference voltage causes the selected cell to conduct, it may be in the first, or lowermost, state. If the second reference voltage causes the selected cell to conduct, it may be in the second state. If the third reference voltage causes the selected cell to conduct it may be in the third state. If the third reference voltage does not cause the cell to conduct, it may be in the fourth, or uppermost, state. Some prior sensing methods and/or circuits may employ independent reference voltages for a number of different programmed levels sensed in an MLC device.

Embodiments of the present disclosure can use a single static reference signal 694, e.g., a voltage and/or current, and employ a state machine 601 to generate a number of dynamic sensing signals to be applied to a selected memory cell 613 and compared to the static reference signal 694 using, for example, a voltage controlled voltage source 607 having a high gain relative to the supply signal 605, e.g., supply voltage, that can act as a comparator. Other comparators can be used with one or more embodiments of the present disclosure. As used with respect to references, a static reference signal can be a reference signal, e.g. a voltage and/or current, that has a substantially constant value, whereas a dynamic reference signal can be a reference signal that has a value that can be changed, e.g., through operation of a state machine.

The signal divider 603 illustrated in FIG. 6 can include a number of resistors selected according to a type of memory cell to be sensed. For example, a two bit PCRAM memory cell can include resistor 610 having a resistance $R_A = \frac{1}{6} \log(R1) + \frac{5}{6} \log(R0)$, and resistors 611 and 612 having resistance $R_B = \frac{1}{3} \log(R1) - \frac{1}{3} \log(R0)$. R1 can represent the amorphous-most state for the particular memory cell 613, e.g., the state with the highest resistance. R0 can represent the crystalline-most state for the particular memory cell 613, e.g., the state with the lowest resistance. As an example of an embodiment of the present disclosure associated with a resistive switching memory device, a two bit RRAM memory cell can include resistor 610 having a resistance $R_A = \frac{1}{6} R1 + \frac{5}{6} R0$, and resistors 611 and 612 having resistance $R_B = \frac{1}{3} R1 - \frac{1}{3} R0$. R1 can represent the most resistive state for the particular memory cell 613. R0 can represent the least resistive state for the particular memory cell 613. Thus, a number of equivalent resistances can be generated by a number of combinations of provided resistors to create dynamic sensing references. Such embodiments can be beneficial in providing multiple sensing references using only one supply voltage. Resistors for different types of memory devices, e.g., having other types of resistance variable memory cells or storing different numbers of bits, can be selected by one of ordinary skill in the art having read and understood the present disclosure. Likewise, sensing circuitry 600 can be modified by one of ordinary skill in the art for sensing non-volatile memory cells, e.g., flash cells, by including a conversion for resistance/voltage.

Certain of the number of resistors, e.g., resistors 611 and 612, can be coupled with a bypass device, e.g., bypass devices 621 and 622, for selectively shorting the resistor from the voltage divider. For example, when bypass device 621, e.g., a switch, is on, for example, when Vb is high, resistor 611 can be shorted, and current can flow between resistors 610 and 612 through bypass device 621 rather than through resistor 611.

Accordingly, the supply signal 605 can be divided into a sensing signal according to one or more outputs of the state machine 601. The sensing signal can be applied across a non-volatile multilevel memory cell (MLC), e.g., resistance variable memory cell 613, to generate an output signal, e.g., Vcmp 693. The output signal can be compared to a reference signal, e.g., VREF 694. For example, a comparator, e.g., a voltage controlled voltage source 607 with a high gain relative to the supply signal 605 can be used for comparison. The one or more outputs of the state machine 601 can be adjusted according to a result of comparing the output signal from the MLC to the reference signal. As the reader will appreciate, such an iterative process can be used to sense multilevel cells, e.g., determine a programmed state of a multilevel cell, for cells that store a number of states. The various signals described above can include voltages and/or currents.

FIG. 7 illustrates a table 700 reflecting equivalent resistances corresponding to a portion of the circuit illustrated in FIG. 6 in accordance with one or more embodiments of the present disclosure. The equivalent resistances "Self on-die reference Req" listed in table 700 can correspond to an equivalent resistance that can be generated using the voltage divider illustrated in FIG. 6. The equivalent resistance can represent the total resistance between Vcc 605 and Rx 613 in the voltage divider 603, e.g., a first portion of the voltage divider, illustrated in FIG. 6. That is, the equivalent resistance can represent a resistance value of a single resistor replacing the active, e.g., not bypassed or shorted, resistors between Vcc 605 and Rx 613. For ease of illustration and explanation, resistance values of $R_A = \frac{1}{6} \log(R1)$ and $R_B = \frac{1}{3} \log(R1)$ have been chosen for an example PCRAM device. Likewise, resistance values $R_A = \frac{1}{6} R1$ and $R_B = \frac{1}{3} R1$ have been chosen for an RRAM device. The values in table 700 can indicate an equivalent resistance depending on a state of on-die references, e.g., state machine inputs and/or outputs Va and Vb. As described above, when Vb is high, bypass device 621 in FIG. 6 can be on such that resistor 611 is bypassed. Likewise, when Va is high, bypass device 620 can be on such that resistor 612 is bypassed. Conversely when Va and/or Vb are low, their respective bypass devices are off, which can allow current to flow through the associated resistor.

As illustrated in table 700, when both Va and Vb are low, current can flow through resistors 610, 611, and 612 in FIG. 6, creating an equivalent resistance of $\frac{5}{6} R1$ (e.g., "Rmax") or $\frac{5}{6} \log R1$. When Va is high and Vb is low, or when Va is low and Vb is high, current can flow through resistor 610 and one of resistors 611 and 612 in FIG. 6. Accordingly, equivalent resistances generated according to conditions (Va high and Vb low) or (Va low and Vb high) can be the same. For example, an equivalent resistance of $\frac{1}{2} R1$ can be generated for the example of a RRAM device provided above, or an equivalent resistance of $\frac{1}{2} \log R1$ can be generated for the example of a PCRAM device provided above. When Va and Vb are high, current can flow through resistor 610 in FIG. 6, generating an equivalent resistance of $\frac{1}{6} R1$ or $\frac{1}{6} \log R1$.

Figure 8:
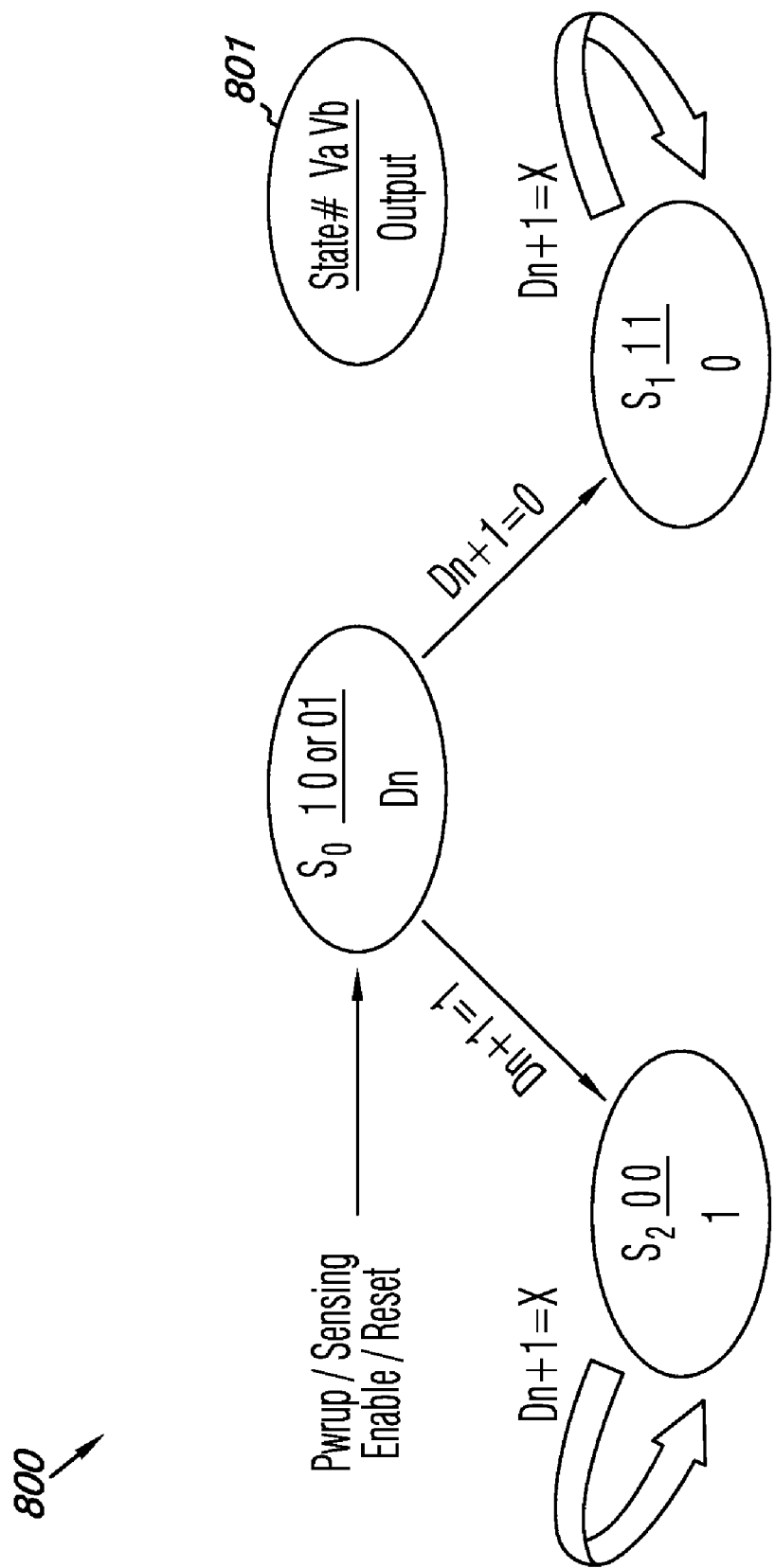
FIG. 8 illustrates an embodiment of a state diagram for sensing a non-volatile memory device in accordance with one or more embodiments of the present disclosure.

FIG. 8 illustrates an embodiment of a state diagram 800 for sensing a non-volatile memory device in accordance with one or more embodiments of the present disclosure. As indicated in legend 801, a top portion of each oval represents the state number "State#." The numbers following the state number represent the values Va and Vb, as described herein. A bottom portion of each oval represents an output, e.g., a binary digit corresponding to data being read. Thus, after powerup, sensing enable, and a reset pulse, an initial state "$S_0$" can be 10 or 01 with an output "Dn." Having initial values of 01 or 10 for Va and Vb, can generate a common equivalent voltage, according to the embodiment illustrated in FIG. 6, where resistors 611 and 612 have a common resistance $R_B$. The value Dn can be stored in a latch and/or register when the next state of Dn, e.g., "Dn+1" is determined. With Va and Vb equal to 1, at state 1 "$S_1$," Dn+1 can be determined as 0. With Va and Vb equal to 0, at state 2 "$S_2$," Dn+1 can be determined as 1. As indicated in FIG. 8, control functions can be simplified such that Va=inv(Rst)*X and Vb=Rst+X, where X=Va*(inv(Dn)+Vb). Examples of a number of signals associate with sensing operations according to the embodiments described with respect to FIGS. 6-8 are described below with respect to FIG. 9.

Figure 9:
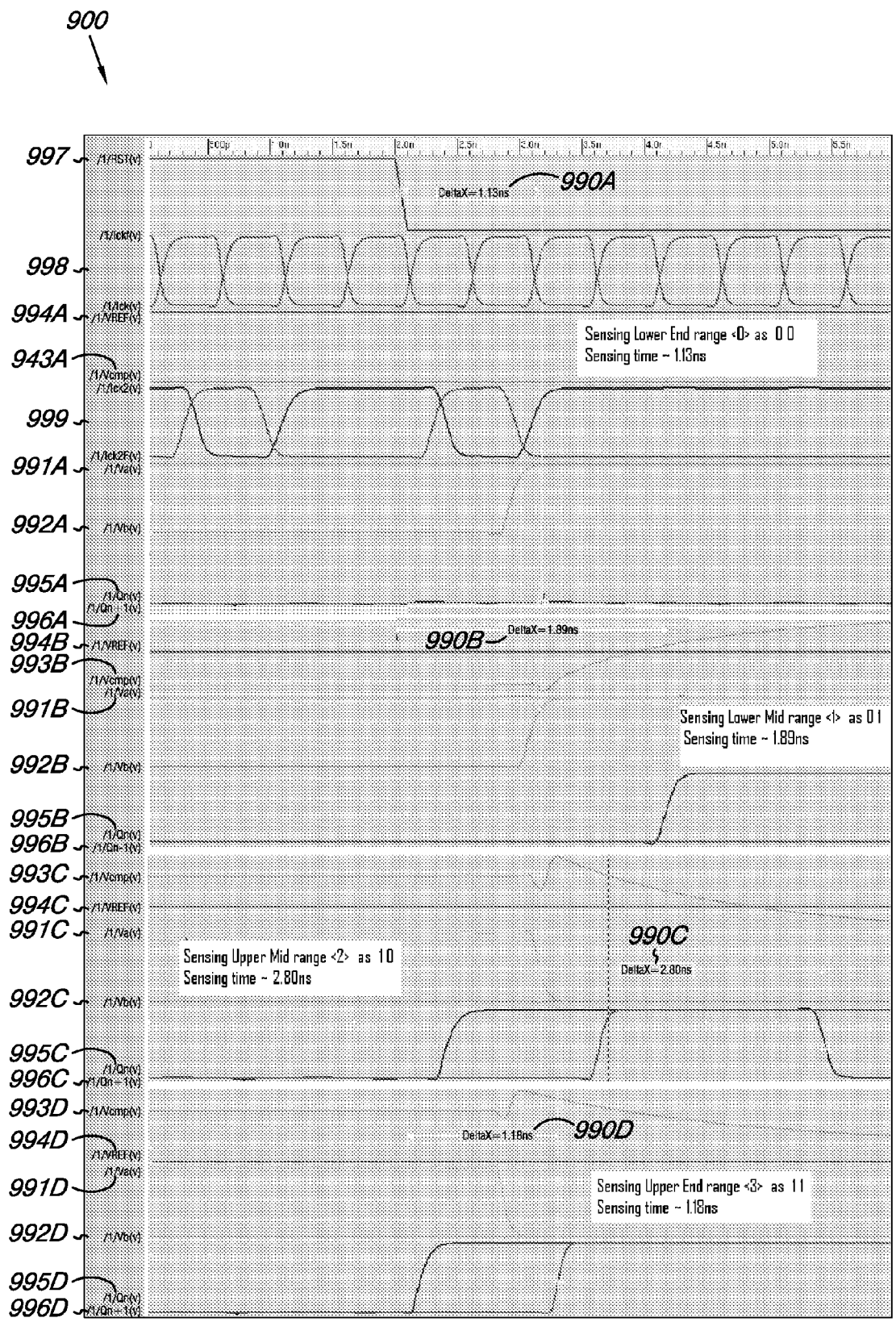
FIG. 9 illustrates a graph of various signals, corresponding to the circuit illustrated in FIG. 6, associated with sensing a memory cell in accordance with one or more embodiments of the present disclosure.

FIG. 9 illustrates a graph 900 of various signals, corresponding to the circuit illustrated in FIG. 6, associated with sensing a memory cell in accordance with one or more embodiments of the present disclosure. A number of signals are illustrated in graph 900, which can represent logical inputs and/or outputs for the state machine 601 in FIG. 6. The graph 900 illustrated in FIG. 9 represents a sensing programmed levels corresponding to binary data states 00, 01, 10, and 11 for a resistance variable memory cell. The RST (reset) signal 997 can trigger an initiation of timing for the sensing operation. Various clock signals are illustrated in FIG. 9, corresponding to clock inputs and/or outputs in FIG. 6. For example, various clock signals are indicated at 998 and 999 in FIG. 9.

Graphs corresponding to sensing a programmed level corresponding to data state 00 are indicated by the suffix "A" following the numeral designation, e.g., "990A." As illustrated in graph 900, Va 991A can start high and Vb 992A can start low. Referring to FIG. 6, initial conditions Va high and Vb low can correspond to bypassing resistor 612, such that a sum of the resistance on a first portion of the voltage divider 603, e.g., an equivalent resistance analogous to the description provided above with respect to FIG. 7, is $R_A$ 610+$R_B$ 611. Qn 995A and Qn+1 996A can both start low.

Although Qn 995A and Qn+1 996A may appear to change in this example, the reader will appreciate that these changes can represent noise or other interference rather than meaningful changes. Accordingly, in this example, Qn 995A and Qn+1 996A can be approximated as 0V. VREF (static reference voltage) 994A, is provided as a static reference, e.g., at 600 mV in this example. Vcmp 993A can be a generated sensing reference, e.g., and output of the voltage divider 603 in FIG. 6 at Vcmp (comparison voltage and/or dynamic reference voltage) 693. Vcmp 993A, in this example, starts low, e.g., at 0 V. As Vcmp 993A is low for inputs Va 991A high and Vb 992A low, a first digit of binary data corresponding to the programmed state of the memory cell being sensed can be identified as a 0, e.g., Qn 995A is low.

As illustrated in the graph 900, Vb 992A transitions high, e.g., as controlled by state machine 601 in FIG. 6. Accordingly, a second set of inputs and/or outputs for state machine 601 can be Va high and Vb high such that resistors 611 and 612 are bypassed, providing an equivalent resistance of $R_A$ 610 for a portion of the voltage divider 603. In response to Vb 992A transitioning high, Vcmp 993A continues to remain low. Accordingly, a second digit of binary data corresponding to the programmed state of the memory cell being sensed can be identified as a 0, e.g., Qn 995A stays low. A sensing time for this operation is illustrated at "DeltaX" 990A as 1.13 nanoseconds, as measured from RST 997 signal to a point where Vb 992A transitions high and Qn 995A remains low.

Graphs corresponding to sensing a programmed level corresponding to data state 01 are indicated by the suffix "B" following the numeral designation, e.g., "990B." The RST signal 997 can trigger an initiation of timing for the sensing operation. As illustrated in graph 900, Va 991B can start high and Vb 992B can start low. Referring to FIG. 6, initial conditions Va high and Vb low can correspond to bypassing resistor 612, such that a sum of the resistance on a first portion of the voltage divider 603, e.g., an equivalent resistance analogous to the description provided above with respect to FIG. 7, is $R_A$ 610+$R_B$ 611. Qn 995B and Qn+1 996B can both start low. VREF 994B, is provided as a static reference, e.g., at 600 mV in this example. Vcmp 993B can be a generated sensing reference, e.g., and output of the voltage divider 603 in FIG. 6 at Vcmp 993B. Vcmp 993B, in this example, starts low, e.g., below VREF 994B. As Vcmp 993B is low for inputs Va 991B high and Vb 992B low, a first digit of binary data corresponding to the programmed state of the memory cell being sensed can be identified as a 0, e.g., Qn 995B is low.

As illustrated in the graph 900, Vb 992B transitions high, e.g., as controlled by state machine 601 in FIG. 6. Accordingly, a second set of inputs and/or outputs for state machine 601 can be Va high and Vb high such that resistors 611 and 612 are bypassed, providing an equivalent resistance of $R_A$ 610 for a portion of the voltage divider 603. In response to Vb 992B transitioning high, Vcmp 993B transitions high, e.g., the value of Vcmp 993B increases above that of VREF 994B. Accordingly, a second digit of binary data corresponding to the programmed state of the memory cell being sensed can be identified as a 1, e.g., Qn 995B also transitions high. A sensing time for this operation is illustrated at "DeltaX" 990B as 1.89 nanoseconds, as measured from RST 997 signal to a point where Qn 995B transitions high.

Graphs corresponding to sensing a programmed level corresponding to data state 10 are indicated by the suffix "C" following the numeral designation, e.g., "990C." The RST signal 997 can trigger an initiation of timing for the sensing operation. As illustrated in graph 900, Va 991C can start high and Mb 992C can start low. Referring to FIG. 6, initial conditions Va high and Vb low can correspond to bypassing resistor 612, such that a sum of the resistance on a first portion of the voltage divider 603, e.g., an equivalent resistance analogous to the description provided above with respect to FIG. 7, is $R_A$ 610+$R_B$ 611. Qn 995C and Qn+1 996C can both start low. VREF 994C, is provided as a static reference, e.g., at 600 mV in this example. Vcmp 993C can be a generated sensing reference, e.g., and output of the voltage divider 603 in FIG. 6 at Vcmp 693. Vcmp 993C, in this example, starts high, e.g., at a value greater than the value of VREF 994C. As Vcmp 993C is high for inputs Va 991C high and Vb 992C low, a first digit of binary data corresponding to the programmed state of the memory cell being sensed can be identified as a 1, e.g., Qn 995C transitions high after RST 997 flips and before Va 991C transitions low.

As illustrated in the graph 900, Va 991C transitions low, e.g., as controlled by state machine 601 in FIG. 6. Accordingly, a second set of inputs and/or outputs for state machine 601 can be Va low and Vb low such that resistors 611 and 612 are not bypassed, providing an equivalent resistance of $R_A$ 610+$R_B$ 611+$R_B$ 612 for a portion of the voltage divider 603. In response to Va 991C transitioning low, Vcmp 993C transitions low, e.g., the value of Vcmp 993C decreases below that of VREF 994C. Accordingly, a second digit of binary data corresponding to the programmed state of the memory cell being sensed can be identified as a 0, e.g., Qn 995C transitions low. A sensing time for this operation is illustrated at "DeltaX" 990C as 2.80 nanoseconds, as measured from RST 997 signal to a point where Qn 995C transitions low.

Graphs corresponding to sensing a programmed level corresponding to data state 11 are indicated by the suffix "D" following the numeral designation, e.g., "990D." The RST signal 997 can trigger an initiation of timing for the sensing operation. As illustrated in graph 900, Va 991D can start high and Vb 992D can start low. Referring to FIG. 6, initial conditions Va high and Vb low can correspond to bypassing resistor 612, such that a sum of the resistance on a first portion of the voltage divider 603, e.g., an equivalent resistance analogous to the description provided above with respect to FIG. 7, is $R_A$ 610+$R_B$ 611. Qn 995D and Qn+1 996D can both start low. VREF 994D, is provided as a static reference, e.g., at 600 mV in this example. Vcmp 993D can be a generated sensing reference, e.g., and output of the voltage divider 603 in FIG. 6 at Vcmp 693. Vcmp 993D, in this example, starts high, e.g., at a value greater than VREF 994D. As Vcmp 993D is high for inputs Va 991D high and Vb 992D low, a first digit of binary data corresponding to the programmed state of the memory cell being sensed can be identified as a 1, e.g., Qn 995D is transitions high after RST 997 flips and before Va 991D transitions low.

As illustrated in the graph 900, Va 991D transitions low, e.g., as controlled by state machine 601 in FIG. 6. Accordingly, a second set of inputs and/or outputs for state machine 601 can be Va low and Vb low such that resistors 611 and 612 are not bypassed, providing an equivalent resistance of $R_A$ 610+$R_B$ 611+$R_B$ 612 for a portion of the voltage divider 603. In response to Va 991D transitioning low, Vcmp 993D decreases, but remains high, e.g., greater than VREF 994D. Accordingly, a second digit of binary data corresponding to the programmed state of the memory cell being sensed can be identified as a 1, e.g., Qn 995D remains high after Va 991D transitions low. A sensing time for this operation is illustrated at "DeltaX" 990D as 1.18 nanoseconds, as measured from RST 997 signal to a point where Va 991D transitions low and Qn+1 996D transitions high.

As the reader will appreciate from the above descriptions of FIG. 9, the greatest sensing time for any of the four example programmed levels was 2.80 nanoseconds. Accordingly, one or more embodiments of the present disclosure can provide a sensing method and/or device that can sense a memory cell in less than three nanoseconds. Likewise, timing of one or more sensing operations can be adjusted according to a combined resistance associated with the number of resistors and/or a switching of logic associated with adjusting the output of a state machine, e.g., state machine 601 in FIG. 6. For example, timing of sensing operations can be adjusted through the use of one or more delay elements associated with sensing circuitry.

Figure 10:
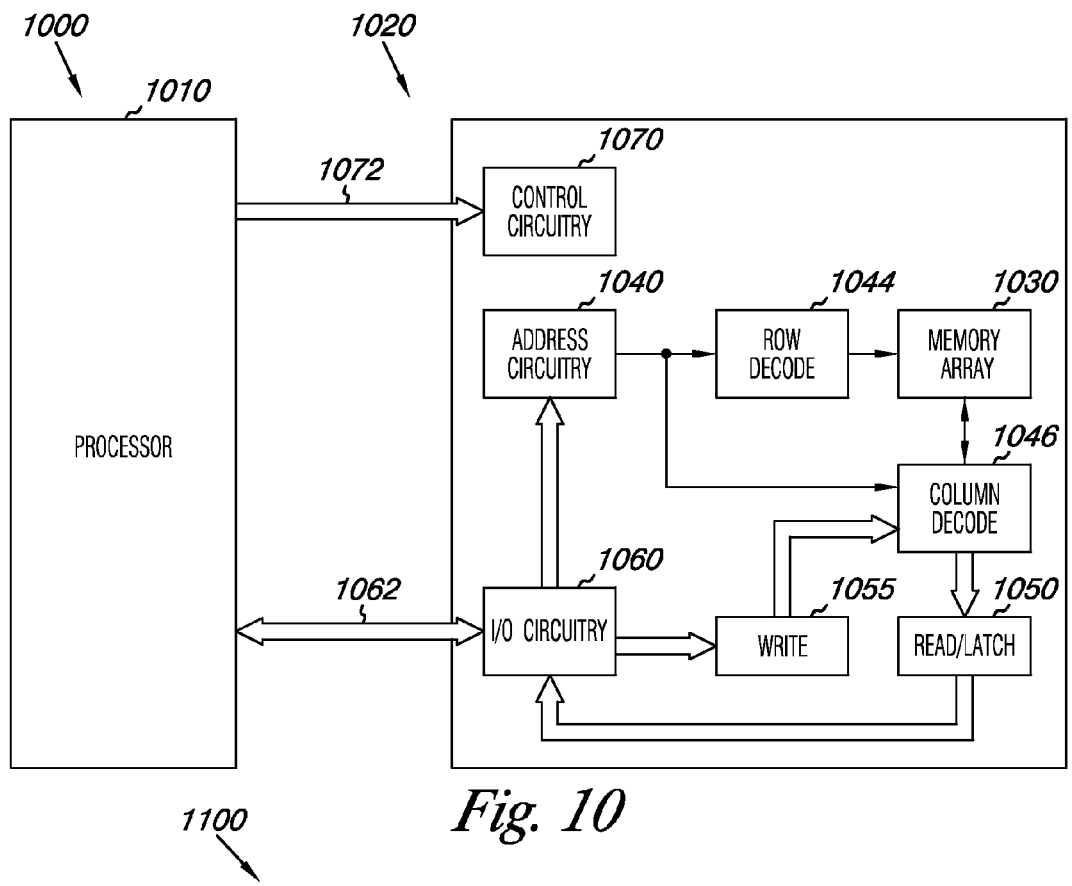
FIG. 10 is a functional block diagram of an electronic memory system having at least one memory device operated in accordance with one or more embodiments of the present disclosure.

FIG. 10 is a functional block diagram of an electronic memory system 1000 having at least one memory device 1020 operated in accordance with one or more embodiments of the present disclosure. Memory system 1000 includes a processor 1010 coupled to a memory device 1020 that includes a memory array 1030 of memory cells. The memory system 1000 can include separate integrated circuits or both the processor 1010 and the memory device 1020 can be on the same integrated circuit. The processor 1010 can be a microprocessor or some other type of controlling circuitry such as an application-specific integrated circuit (ASIC).

The memory device 1020 includes an array of memory cells 1030, which can be resistance variable memory cells with a PCRAM architecture, for example. The embodiment of FIG. 10 includes address circuitry 1040 to latch address signals provided over I/O connections 1062 through I/O circuitry 1060. Address signals are received and decoded by a row decoder 1044 and a column decoder 1046 to access the memory array 1030. It will be appreciated by those skilled in the art that the number of address input connections depends on the density and architecture of the memory array 1030 and that the number of addresses increases with both increased numbers of memory cells and increased numbers of memory blocks and arrays.

The memory array 1030 can include multilevel memory cells having different numbers of programmed levels, sensing references, etc., according to embodiments described herein. The read/latch circuitry 1050 can read and latch a page or row of data from the memory array 1030. I/O circuitry 1060 is included for bi-directional data communication over the I/O connections 1062 with the processor 1010. Write circuitry 1055 is included to write data to the memory array 1030.

Control circuitry 1070 decodes signals provided by control connections 1072 from the processor 1010. These signals can include chip signals, write enable signals, and address latch signals that are used to control the operations on the memory array 1030, including data sensing, data write, and data erase operations. In some embodiments, the control circuitry 1070 is responsible for executing instructions from the processor 1010 to perform the operations according to embodiments of the present disclosure. The control circuitry 1070 can be a state machine, e.g., state machine 601 in FIG. 6, a sequencer, or some other type of controller. It will be appreciated by those skilled in the art that additional circuitry and control signals can be provided, and that the memory device detail of FIG. 10 has been reduced to facilitate ease of illustration.

Figure 11:
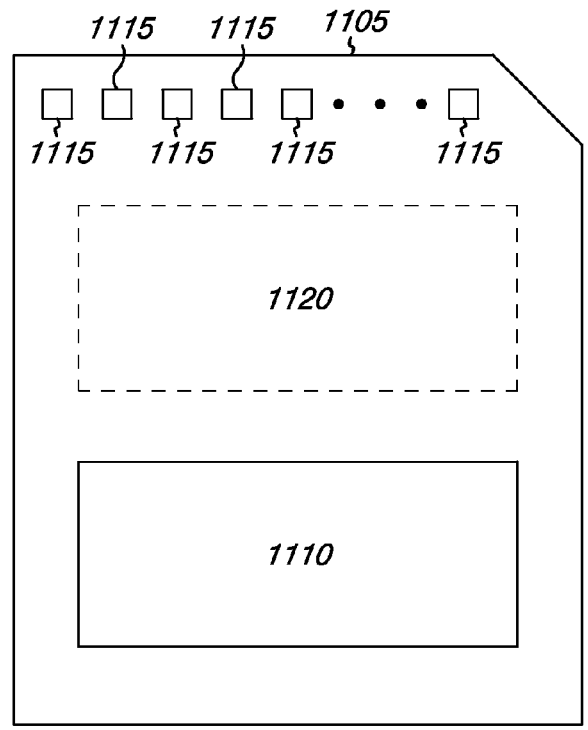
FIG. 11 illustrates a functional block diagram of a memory module having at least one memory device in accordance with one or more embodiments of the present disclosure.

FIG. 11 illustrates a functional block diagram of a memory module having at least one memory device in accordance with one or more embodiments of the present disclosure. Memory module 1100 is illustrated as a memory card, although the concepts discussed with reference to memory module 1100 are applicable to other types of removable or portable memory (e.g., USB interface drives) and are intended to be within the scope of "memory module" as used herein. In addition, although one example form factor is depicted in FIG. 11, these concepts are applicable to other form factors as well.

In some embodiments, memory module 1100 will include a housing 1105 (as depicted) to enclose one or more memory devices 1110, though such a housing is not essential to all devices or device applications. At least one memory device 1110 includes an array of multilevel memory cells that can be sensed according to embodiments described herein. Where present, the housing 1105 includes one or more contacts 1115 for communication with a host device. Examples of host devices include digital cameras, digital recording and playback devices, PDAs, personal computers, memory card readers, interface hubs and the like. For some embodiments, the contacts 1115 are in the form of a standardized interface. For example, with a USB interface drive, the contacts 1115 might be in the form of a USB Type-A male connector. In general, contacts 1115 provide an interface for passing control, address and/or data signals between the memory module 1100 and a host having compatible receptors for the contacts 1115.

The memory module 1100 may optionally include additional circuitry 1120, which may be one or more integrated circuits and/or discrete components. For some embodiments, the additional circuitry 1120 may include control circuitry, such as a memory controller, for controlling access across multiple memory devices 1110 and/or for providing a translation layer between an external host and a memory device 1110. For example, there may not be a one-to-one correspondence between the number of contacts 1115 and a number of 1110 connections to the one or more memory devices 1110. Thus, a memory controller could selectively couple an I/O connection (not shown in FIG. 11) of a memory device 1110 to receive the appropriate signal at the appropriate I/O connection at the appropriate time or to provide the appropriate signal at the appropriate contact 1115 at the appropriate time. Similarly, the communication protocol between a host and the memory module 1100 may be different than what is required for access of a memory device 1110. A memory controller could then translate the command sequences received from a host into the appropriate command sequences to achieve the desired access to the memory device 1110. Such translation may further include changes in signal voltage levels in addition to command sequences.

The additional circuitry 1120 may further include functionality unrelated to control of a memory device 1110 such as logic functions as might be performed by an ASIC. Also, the additional circuitry 1120 may include circuitry to restrict read or write access to the memory module 1100, such as password protection, biometrics or the like. The additional circuitry 1120 may include circuitry to indicate a status of the memory module 1100. For example, the additional circuitry 1120 may include functionality to determine whether power is being supplied to the memory module 1100 and whether the memory module 1100 is currently being accessed, and to display an indication of its status, such as a solid light while powered and a flashing light while being accessed. The additional circuitry 1120 may further include passive devices, such as decoupling capacitors to help regulate power requirements within the memory module 1100.

CONCLUSION

The present disclosure includes methods, devices, modules, and systems for sensing memory cells using a state machine. One method embodiment includes generating a first sensing reference according to a first output of a state machine. The method includes bifurcating a range of possible programmed levels to which a memory cell can be programmed with the first sensing reference. The method also includes generating a second sensing reference according to a second output of the state machine. The method further includes determining a programmed level of the memory cell with the second generated sensing reference.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for sensing memory cells, comprising:
   generating a first sensing reference according to a first output of a state machine;
   bifurcating a range of possible programmed levels to which a memory cell can be programmed with the first sensing reference;
   generating a second sensing reference according to a second output of the state machine; and
   determining a programmed level of the memory cell with the second generated sensing reference.

2. The method of claim 1, wherein bifurcating the range of possible programmed levels includes determining a first bit corresponding to the programmed level of the memory cell.

3. The method of claim 1, wherein the method includes generating the second sensing reference based on results of bifurcating the range of possible programmed levels with the first sensing reference.

4. The method of claim 3, wherein:
   bifurcating the range of possible programmed levels includes bifurcating into a first and a second subset of the range; and
   generating the second sensing reference includes generating a sensing reference associated with one of the first and the second subsets of the range.

5. The method of claim 1, wherein determining the programmed level includes comparing a static reference to at least the first and the second sensing references.

6. The method of claim 5, wherein comparing the static reference to the first sensing reference includes determining that the programmed level of the memory cell is within a subset of the range of possible programmed levels.

7. A method for sensing memory cells, comprising:
   dividing a supply signal into two or more sensing signals according to one or more outputs of a state machine;
   applying each of the two or more sensing signals across a non-volatile multilevel memory cell (MLC) to generate two or more output signals from the MLC;
   comparing each of the two or more output signals from the MLC to a reference signal; and
   adjusting the one or more outputs of the state machine according to a result of comparing at least one of the two or more output signals from the MLC to the reference signal.

8. The method of claim 7, wherein comparing each of the two or more output signals to the reference signal includes determining a programmed state of the MLC.

9. The method of claim 8, wherein determining the programmed state of the MLC includes determining the programmed state in less than 3 nanoseconds.

10. The method of claim 7, wherein dividing the supply signal includes dividing a supply voltage by shorting at least one of a number of resistors connected in series according to the one or more outputs of the state machine.

11. The method of claim 10, wherein the method includes adjusting sensing timing according to a combined resistance associated with the number of resistors and a switching of logic associated with adjusting the one or more outputs of the state machine.

12. The method of claim 10, wherein dividing the supply signal includes:
dividing the supply signal into a first sensing signal; and
dividing the supply signal into a second sensing signal according to a result of comparing a first of the two or more output signals from the MLC to the reference signal.

13. The method of claim 7, wherein comparing each of the two or more output signals from the MLC to the reference signal includes comparing each of two or more output voltages from the MLC to a reference voltage.

14. The method of claim 7, wherein comparing each of the two or more output signals from the MLC to the reference signal includes comparing each of two or more output currents from the MLC to a reference current.

15. A method for sensing memory cells, comprising:
applying a set of inputs to a state machine;
adjusting a first resistivity component of a voltage divider according to the set of inputs;
selecting a resistance variable multilevel memory cell (MLC) as a second resistivity component of the voltage divider;
applying a supply voltage to the first resistivity component;
comparing a reference voltage to a first output of the voltage divider;
logically adjusting the set of inputs to the state machine according to results of comparing the reference voltage to the first output of the voltage divider;
adjusting the first resistivity component according to the adjusted set of inputs to the state machine; and
comparing the reference voltage to a second output of the voltage divider.

16. A memory device comprising:
an array of non-volatile multilevel memory cells (MLCs); and
sensing circuitry coupled to the array, including:
a static sensing reference; and
a state machine having a set of variable inputs;
wherein the sensing circuitry is configured to:
generate a first dynamic sensing reference according to a first set of inputs to the state machine;
adjust the set of variable inputs from a first set to a second set according to a comparison of the first dynamic sensing reference to the static sensing reference;
generate a second dynamic sensing reference according to the second set of inputs; and
sense a programmed state of a selected memory cell.

17. The memory device of claim 16, wherein:
the first and the second dynamic sensing references are generated by supplying a voltage to a number of resistors arranged in series; and
the set of variable inputs control which, if any, of the number of resistors are shorted.

18. The memory device of claim 17, wherein:
the number of resistors arranged in series are a first resistive component of a voltage divider;
the selected memory cell is a second resistive component of the voltage divider; and
the first and the second dynamic sensing references are outputs of the voltage divider.

19. The memory device of claim 16, wherein the selected memory cell is a resistance variable memory cell selected from the group including:
phase change random access memory (PCRAM) cells; and
resistive random access memory (RRAM) cells.

20. The memory device of claim 16, wherein:
the comparison of the first dynamic sensing reference to the static sensing reference indicates at least one bit of a number of bits corresponding to the programmed state of the selected memory cell; and
the at least one bit is stored in a register associated with the state machine.

21. The memory device of claim 20, wherein a comparison of the second dynamic sensing reference to the static sensing reference indicates at least another bit of the number of bits corresponding to the programmed state of the selected memory cell.

22. A memory device, comprising:
an array of resistance variable multilevel memory cells (MLCs);
sensing circuitry coupled to the array, including:
a supply voltage connected to a number of resistors and selectively connected to a particular MLC; and
a state machine having:
outputs that short certain of the number of resistors;
inputs from a comparing mechanism that is connected to a static reference voltage and to the supply voltage via the number of resistors; and
logic that determines a programmed state of the particular MLC according to the inputs from the comparing mechanism.

23. The memory device of claim 22, wherein:
the state machine includes a number of registers and inputs from a number of clocks to adjust timing of a sensing operation; and
timing of the sensing operation is adjusted according to a number of logic gates associated with the state machine that switch according to changed inputs.

24. The memory device of claim 22, wherein a number of control functions for the state machine are defined as:

$$Va = \text{inv}(Rst) * X;$$

$$Vb = Rst + X; \text{ and}$$

$$X = Va * (\text{inv}(Dn) + Vb);$$

wherein Va and Vb are outputs of the state machine that short certain of the number of resistors, inv is an inverse, Rst is a reset signal, and Dn is a state.

25. The memory device of claim 22, wherein the comparing mechanism is a voltage controlled voltage source that functions as a comparator and has a high gain relative to the supply voltage.

26. The memory device of claim 22, wherein outputs of the state machine short certain of the number of resistors to generate a number of sensing reference voltages.

27. The memory device of claim 26, wherein:
the comparing mechanism receives input from the static reference voltage and at least one sensing reference voltage; and
logic determines the programmed state of the particular MLC according to inputs from the comparing mechanism that indicate a result of comparing the static reference voltage and the at least one sensing reference voltage.

* * * * *